(12) United States Patent
Chen

(10) Patent No.: US 6,603,666 B2
(45) Date of Patent: Aug. 5, 2003

(54) COMPUTER EXPANSION CARD MOUNTING STRUCTURE

(75) Inventor: Yun-Lung Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/096,735

(22) Filed: Mar. 12, 2002

(65) Prior Publication Data

US 2003/0107879 A1 Jun. 12, 2003

(30) Foreign Application Priority Data

Dec. 12, 2001 (CN) .......................................... 090221695

(51) Int. Cl.⁷ ................................................. H05K 5/00

(52) U.S. Cl. ........................ 361/759; 361/816; 361/818; 174/35 R

(58) Field of Search ................................. 361/752, 755, 361/740, 741, 756, 759, 796, 799, 800–802, 816, 818, 686; 174/35 R, 51

(56) References Cited

U.S. PATENT DOCUMENTS

| | | | | | |
|---|---|---|---|---|---|
| 5,650,922 | A | * | 7/1997 | Ho .............................. | 361/753 |
| 5,679,923 | A | * | 10/1997 | Le .............................. | 174/35 R |
| 5,856,632 | A | * | 1/1999 | Bostrom et al. ........ | 174/35 GC |
| 5,929,376 | A | * | 7/1999 | Doun et al. ............. | 174/35 GC |
| 6,018,464 | A | * | 1/2000 | Kim ......................... | 174/35 R |
| 6,058,025 | A | * | 5/2000 | Ecker et al. .............. | 174/35 R |
| 6,063,999 | A | * | 5/2000 | Kelly ....................... | 174/35 R |
| 6,201,711 | B1 | * | 3/2001 | Cherniski et al. ....... | 174/35 GC |

* cited by examiner

*Primary Examiner*—David Martin
*Assistant Examiner*—Thanh S. Phan
(74) *Attorney, Agent, or Firm*—Wei Te Chung

(57) ABSTRACT

An expansion card mounting structure includes a card mounting seat (11), and a plurality of covers (18) to mount expansion cards thereon. The card mounting seat defines a plurality of expansion slots (12) therein. A plurality of spaced projecting contact fingers (16) is integrally formed on the card mounting seat along longitudinal extremities of the expansion slots. In assembly, the covers are secured to the card mounting seat and cover the expansion slots. The contact fingers deflectably contact the covers, to establish good ground connection and thereby attenuate EMI.

8 Claims, 3 Drawing Sheets

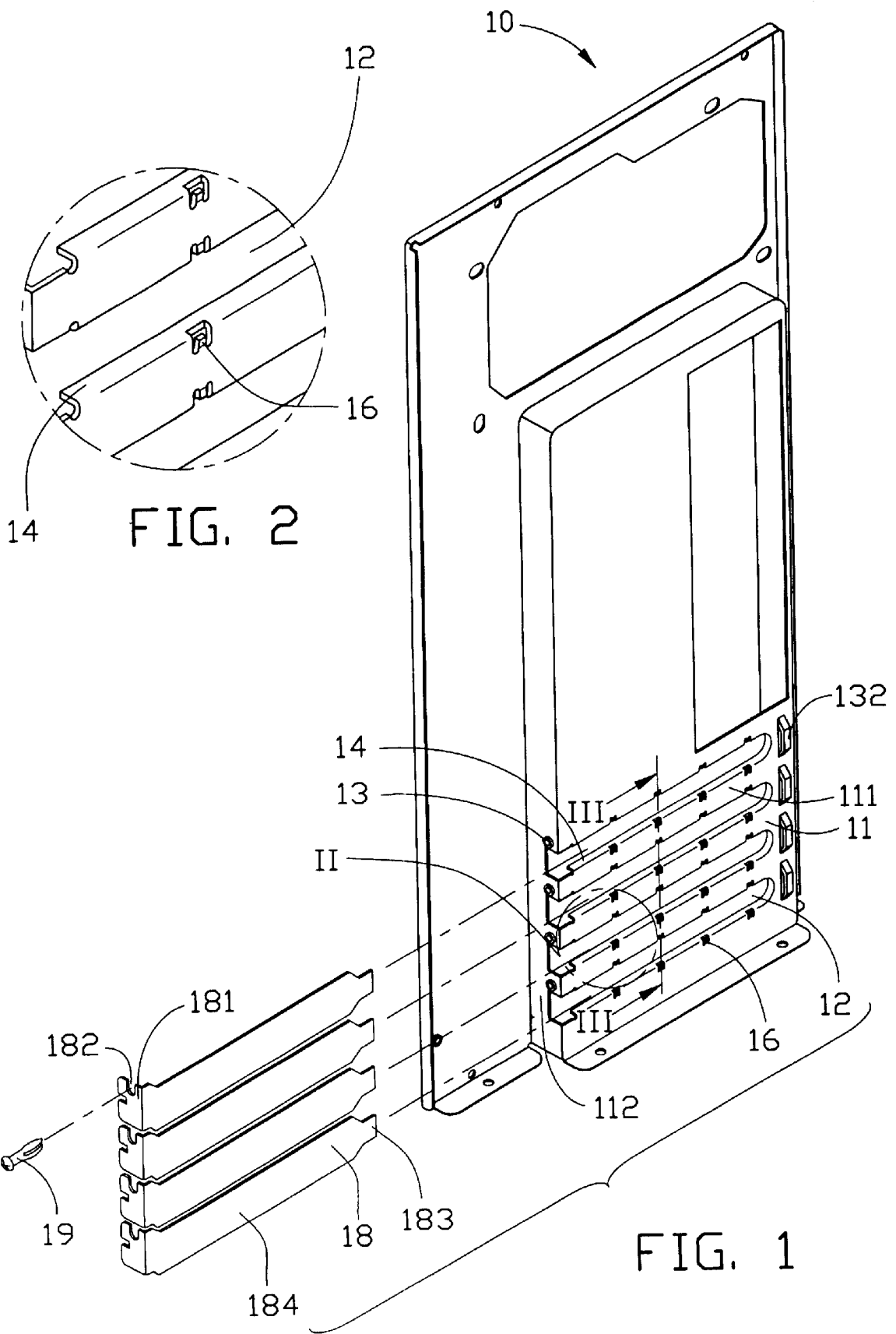

COMPUTER EXPANSION CARD MOUNTING STRUCTURE

BACKGROUND OF THE INVENTION

1. Field of the Invention

The present invention relates to expansion card mounting structures for computers, and more particularly to an expansion card mounting structure which can provide ground connection to attenuate electromagnetic interference (EMI).

2. Description of Related Art

Most computers are designed to have replaceable or expandable equipment and components. Generally, expansion cards or interface cards are the hardware used to allow expansion of functions of personal computers. Consequently, a typical personal computer enclosure is configured to have a number of expansion slots that allow users to install optional expansion cards. However, the number of expansion slots provided proportionately increases the amount of EMI that is emitted from the computer.

Nowadays, most manufacturers recognize the need to improve ground connections and control EMI. A variety of apparatuses have been developed for expansion card mounting structures to attenuate EMI.

U.S. Pat. No. 5,650,922 by Ho discloses an expansion card mounting structure which provides ground connection for expansion cards. The mounting structure comprises a card mounting seat and a ground plate. The mounting seat is provided with a plurality of first slots. Both lateral sides of each first slot are respectively provided with retaining holes. The ground plate has a shape substantially identical to that of the card mounting seat. The ground plate defines a plurality of second slots for matching with the first slots of the card mounting seat. The lateral sides of each second slot are respectively provided with hooking means for matching with the retaining holes of the card mounting seat. Each second slot also has a plurality of projecting contact pieces at rims of the lateral sides thereof.

In use of the card mounting structure of Ho, the ground plate is fitted into the card mounting seat such that the hooking means of the ground plate engage in the retaining holes of the card mounting seat. The expansion card is inserted into the card mounting seat. The projecting contact pieces at both sides of each second slot tightly contact the expansion card, achieving good ground connection between the expansion card and the card mounting seat.

However, the complex structure of the grounding plate complicates manufacturing of the card mounting structure. Assembly of the grounding plate to the card mounting seat is also unduly complicated. These features increase manufacturing costs. Additionally, computers may accommodate varying numbers of expansion cards. If the number of the expansion cards is changed, then frequently a new grounding plate is also needed. One grounding plate cannot necessarily be universally installed in a variety of different computers. For mass producers, when a new grounding plate is needed, then usually a new die for forming the new grounding plate must be made. This also results in increased costs.

SUMMARY OF THE INVENTION

Accordingly, an object of the present invention is to provide an expansion card mounting structure which provides ground connection to attenuate electromagnetic interference (EMI).

Another object of the present invention is to provide an expansion card mounting structure which is simple.

A further object of the present invention is provide an expansion card mounting structure which is cost-efficient.

In order to achieve the objects set out above, an expansion card mounting structure comprises a card mounting seat and a plurality of covers to mount expansion cards thereon. The card mounting seat defines a plurality of expansion slots therein. A plurality of spaced projecting contact fingers is integrally formed on the card mounting seat along longitudinal extremities of the expansion slots. In assembly, the covers are secured to the card mounting seat and cover the expansion slots. The contact fingers deflectably contact the covers, to establish good ground connection and thereby attenuate EMI.

Other objects, advantages and novel features of the present invention will become more apparent from the following detailed description when taken in conjunction with the accompanying drawings.

BRIEF DESCRIPTION OF THE DRAWINGS

FIG. 1 is an exploded view of a computer panel having an expansion card mounting structure in accordance with the present invention;

FIG. 2 is an enlarged view of a circled portion II of FIG. 1, showing part of a card mounting seat of the card mounting structure of FIG. 1;

DETAILED DESCRIPTION OF THE INVENTION

Figure 3:
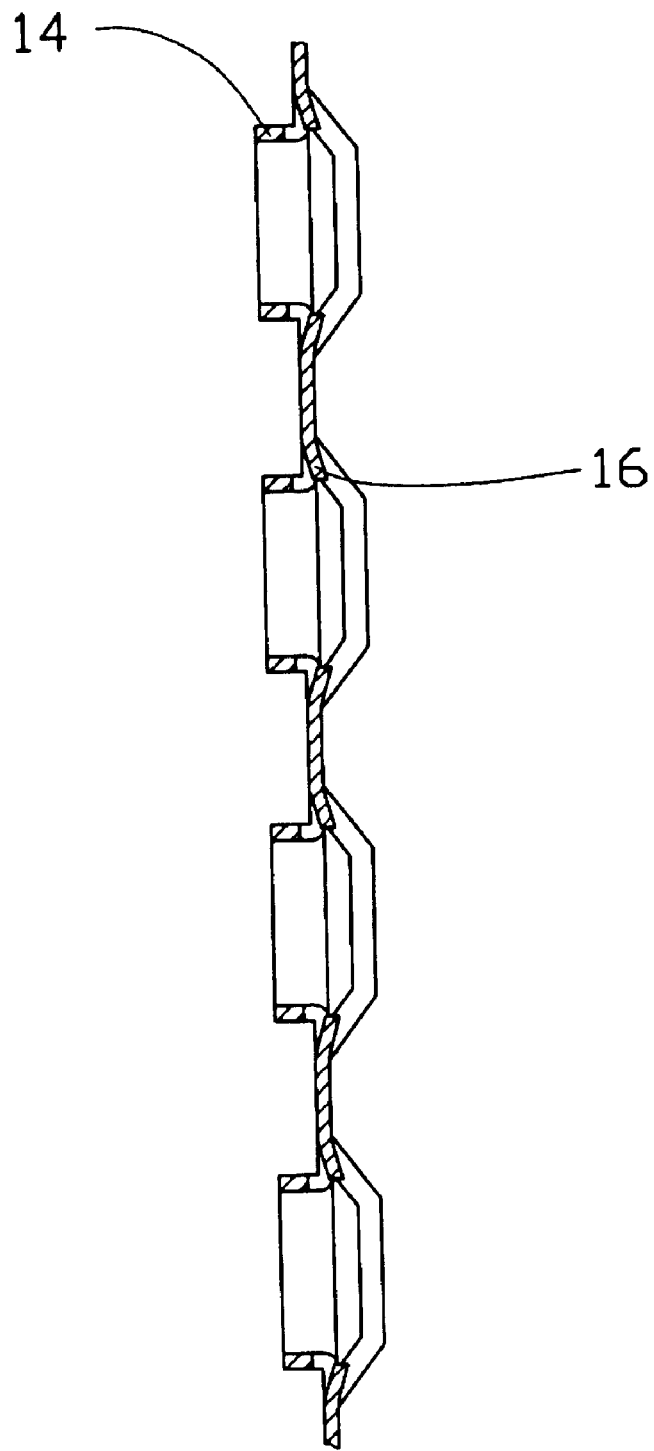
FIG. 3 is a cross-sectional view taken along line III—III of FIG. 1, showing the card mounting seat of the card mounting structure of FIG. 1.
Figure 4:
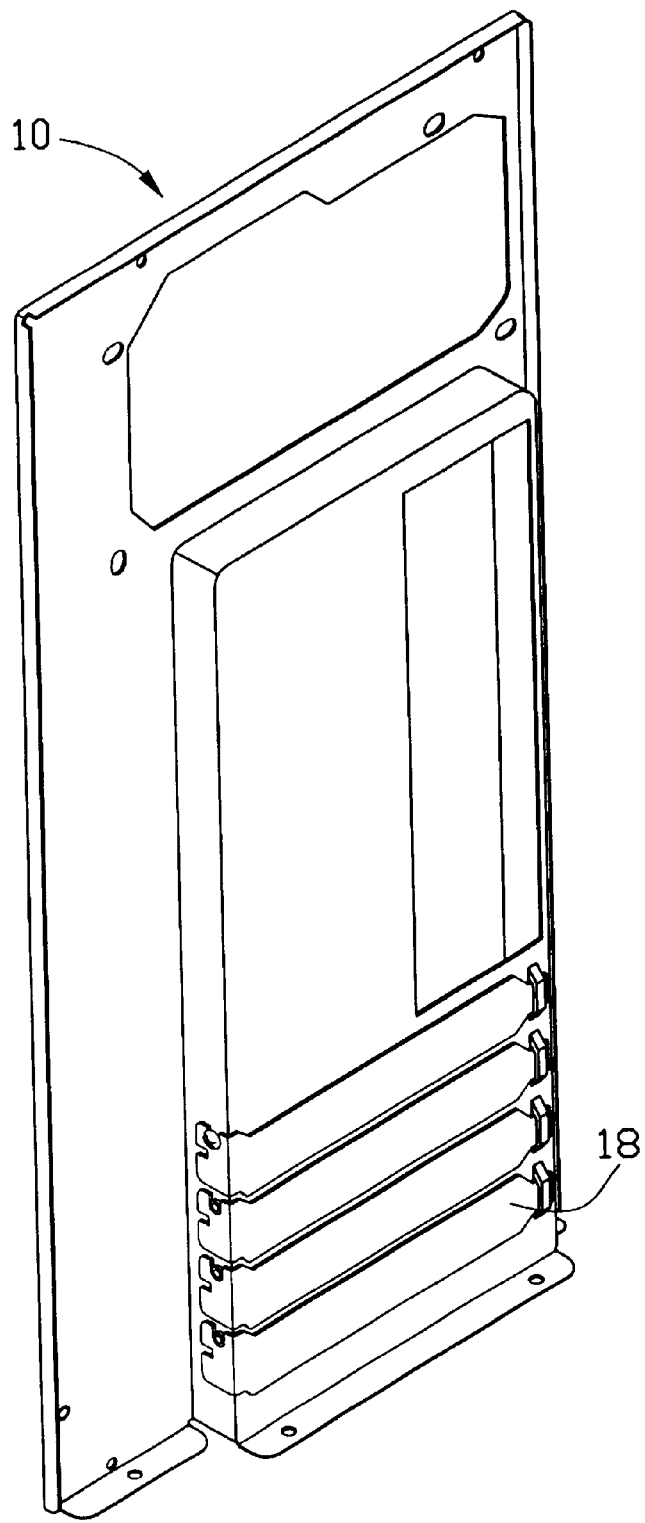
FIG. 4 is an assembled view of FIG. 1.

Reference will now be made to the drawing figures to describe the preferred embodiment of the present invention in detail.

Referring to FIG. 1, an expansion card mounting structure of the present invention comprises a rear panel 10 of a computer and a plurality of covers 18 on which expansion cards (not shown) are mounted. The covers 18 each have a generally L-shaped configuration, comprising a short head 181 and an elongated body 184 that are perpendicular to each other. The body 184 has a tapered tail 183. The head 181 defines an arc-shaped recess 182 in a top edge thereof.

A card mounting seat 11 is disposed at and recessed inwardly from a lower portion of the rear panel 10. A plurality of parallel expansion slots 12 is defined in the card mounting seat 11, for receiving the covers 18. Referring also to FIGS. 2 and 3, a pair of flanges 14 is respectively bent perpendicularly outwardly from a recessed portion 111 of the card mounting seat 11 at each of upper and lower extremities of each expansion slot 12. The flanges 14 reinforce the card mounting seat 11. A plurality of collars 13 is formed on a flanged portion 112 of the card mounting seat 11, the flanged portion 112 being perpendicular to the recessed portion 111. The collars 13 are located above the expansion slots 12, respectively. A plurality of locating tabs 132 is formed on the recessed portion 111 near ends of the expansion slots 12 that are distant from the collars 13, respectively. A plurality of spaced projecting contact fingers 16 is bent inwardly at a junction of each flange 14 and the mounting seat 11, for contacting corresponding covers 18.

Referring to FIGS. 1–4, in assembly, the covers 18 on which expansion cards (not shown) are mounted are secured to the card mounting seat 11 with pins 19 (only one shown). It is well known by persons skilled in the art that the pins 19 can be replaced by bolts or other suitable fasteners. The pins 19 are fittingly extended through the arc-shaped recesses 182 of the covers 18 into the collars 13, respectively. The pins 19 thereby securely fasten the heads 181 of the covers 18 to the flanged portion 112 of the card mounting seat 11. The tails 183 of the covers 18 are fitted into the locating tabs 132, thereby securing the bodies 184 of the covers 18 to the recessed portion 111 of the card mounting seat 11. The covers 18 thereby cover the expansion slots 12. The contact fingers 16 deflectably contact the covers 18. Good ground connection is established between the covers 18 and the card mounting seat 11. Accordingly, good ground connection is established between the expansion cards and the card mounting seat 11. Thus, any EMI emission is effectively attenuated.

The expansion card mounting structure of the present invention has a card mounting seat 11 which establishes good ground connection to attenuate EMI without the need for any additional apparatus. The structure of the card mounting seat 11 is simple. This saves materials and time, and minimizes a cost of the expansion card mounting structure. Furthermore, the expansion card mounting structure can be adopted in a wide variety of computers.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An expansion card mounting structure comprising:

A card mounting seat defining a plurality of expansion slots therein, a plurality of projecting contact fingers being integrally formed on the mounting seat at extremities of the expansion slots; and a plurality of covers adapted for mounting expansion cards thereon, the covers being secured to the card mounting seat to cover the expansion slots;

wherein the projecting contact fingers deflectably contact the cover to establish ground connection and attenuate electromagnetic interference;

wherein a plurality of flanges is perpendicular bent from the card mounting seat at the expansion slots, thereby reinforcing the card mounting seat;

wherein the projecting contact fingers are formed at junctions of the flanges and the card mounting seat, and are bent away from the flanges;

wherein each of the covers is secured to the card mounting seat by a fastener.

2. The expansion card mounting structure as cited in claim 1, wherein the fastener is a pin or a bolt.

3. The expansion card mounting structure as cited in claim 1, wherein the covers each have a generally L-shaped configuration, comprising a short head and an elongated body that are perpendicular to each other.

4. The expansion card mounting structure as cited in claim 3, wherein the body has a tapered tail, and the head has a recess defined in a top edge thereof.

5. The expansion card mounting structure as cited in claim 4, wherein a plurality of collars is formed on the card mounting seat, and each of the collars is located above a corresponding expansion slot.

6. The expansion card mounting structure as cited in claim 5, wherein the fastener is inserted into the recess of a corresponding head and a corresponding collar, thereby securing the head to the card mounting seat.

7. The expansion card mounting structure as cited in claim 5, wherein a plurality of locating tabs is formed on the card mounting seat near ends of the expansion slots that are distant from the collars.

8. The expansion card mounting structure as cited in claim 7, wherein the tapered tails are fitted into the locating tabs to secure the elongated bodies to the card mounting seat.

* * * * *